(12) United States Patent
Kanda

(10) Patent No.: US 10,026,756 B2
(45) Date of Patent: Jul. 17, 2018

(54) DISPLAY DEVICE AND METHOD FOR MANUFACTURING THE SAME

(71) Applicant: Japan Display Inc., Minato-ku (JP)

(72) Inventor: Noriyoshi Kanda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/409,765

(22) Filed: Jan. 19, 2017

(65) Prior Publication Data

US 2017/0221923 A1 Aug. 3, 2017

(30) Foreign Application Priority Data

Feb. 2, 2016 (JP) ................................. 2016-018153

(51) Int. Cl.
*H01L 27/12* (2006.01)
*H01L 27/32* (2006.01)

(52) U.S. Cl.
CPC ........ *H01L 27/124* (2013.01); *H01L 27/1248* (2013.01); *H01L 27/1259* (2013.01); *H01L 27/3258* (2013.01); *H01L 27/3276* (2013.01); *H01L 2227/323* (2013.01)

(58) Field of Classification Search
None
See application file for complete search history.

(56) References Cited

U.S. PATENT DOCUMENTS

2009/0315451 A1* 12/2009 Choi ................... H01L 27/3276
313/504

FOREIGN PATENT DOCUMENTS

JP 2007-317606 12/2007
TW 200501798 A 1/2005

OTHER PUBLICATIONS

Combined Office Action and Search Report dated Nov. 3, 2017 in Taiwanese Patent Application No. 106102809 (with English language translation).

* cited by examiner

*Primary Examiner* — Whitney T Moore
(74) *Attorney, Agent, or Firm* — Oblon, McClelland, Maier & Neustadt, L.L.P.

(57) ABSTRACT

A display device includes: a base layer; pixel electrodes laminated on the base layer; a light emitting element layer laminated on the pixel electrodes; and a common electrode laminated on the light emitting element layer. Each of the pixel electrodes includes a first oxide conductive layer that is in direct contact with the base layer, a metal conductive layer that is in direct contact with the first oxide conductive layer, and a second oxide conductive layer that is in direct contact with the metal conductive layer. The base layer has an adhesion to the first oxide conductive layer that is higher than that of the metal conductive layer. The first oxide conductive layer includes a protrusion part that is extended farther than the metal conductive layer and the second oxide conductive layer in a direction, adjacent two of the pixel electrodes facing each other in the direction.

6 Claims, 7 Drawing Sheets

DISPLAY DEVICE AND METHOD FOR MANUFACTURING THE SAME

CROSS-REFERENCE TO RELATED APPLICATION

The present application claims priority from Japanese application JP2016-018153 filed on Feb. 2, 2016, the content of which is hereby incorporated by reference into this application.

BACKGROUND OF THE INVENTION

1. Field of the Invention

The present invention relates to a display device and a manufacturing method thereof.

2. Description of the Related Art

A display device on which a light emitting element such as an organic electroluminescent element is provided for each pixel is expected to be a display of the next generation. A light emitting element is configured to emit light in a light emitting layer held between a pixel electrode (anode) and a common electrode (anode), the common configuration is to reflect the emitted light at the pixel electrode. In the case of a display device of the top emission type, since emitted light from the light emitting element is extracted from the common electrode side, the pixel electrode is formed as a reflection electrode, and the common electrode is formed as a transmission electrode. In order to enhance light extraction efficiency, it is favorable that the pixel electrode is a reflection film made of a material with high reflectivity.

However, in order to optimize a work function of a hole injection into the light emitting layer, there is a case where an upper surface of the reflection film (a surface that is in contact with the light emitting layer) is covered by an oxide conductive film such as indium tin oxide (ITO) or indium zinc oxide (IZO). Meanwhile, to retain an adhesion to an inorganic insulating film that is a base layer of the pixel electrode, there is a case where the oxide conductive film is provided on a lower surface (a surface that is in contact with the inorganic insulating film) of the reflection film (Japanese Unexamined Patent Publication No. 2007-317606).

When the pixel electrode is formed, for example, when a laminated film made of an ITO film, Ag film and an ITO film is patterned by mixed acid, an etching residue or a remainder of Ag might be generated. This is caused because nitrogen monoxide gas generated by a reaction of the mixed acid and Ag is attached to a surface of the Ag film, and a passivation of the surface of the Ag film in etching liquid occurs.

Therefore, there is a problem that neighboring pixel electrodes are short-circuited since the patterning by the mixed acid is not enough. As a space between pixel electrodes gets smaller due to an enhanced image definition, the etching residue and the remainder of Ag are more likely to be generated. Further, since the adhesion of the Ag film to the inorganic insulating film is low, when the Ag film is not covered by the ITO film the adhesion of the pixel electrode to the base layer gets lower.

Japanese Unexamined Patent Publication No. 2007-317606 discloses sealing the top, the bottom, and the periphery of the AG film by the ITO film, to thereby shut the Ag off from an organic material and prevent a generation of gas due to a reaction of the Ag and the organic material. Accordingly, since the Ag film is covered, the pixel electrode has a high adhesion to the base layer, and the problem that the present invention tries to solve does not exist here at all.

SUMMARY OF THE INVENTION

The present invention is directed to enabling a formation of the pixel electrode that can be hardly peeled off and patterning thereof with a high precision.

A display device includes: a base layer; a plurality of pixel electrodes laminated on the base layer; a light emitting element layer laminated on the plurality of the pixel electrodes; and a common electrode laminated on the light emitting element layer, wherein each of the plurality of pixel electrodes includes a first oxide conductive layer that is in direct contact with the base layer, a metal conductive layer that is in direct contact with the first oxide conductive layer, and a second oxide conductive layer that is in direct contact with the metal conductive layer, wherein the base layer has an adhesion to the first oxide conductive layer that is higher than that of the metal conductive layer, and wherein the first oxide conductive layer includes a protrusion part that is extended farther than the metal conductive layer and the second oxide conductive layer in a direction, adjacent two of the pixel electrodes facing each other in the direction. According to the present invention, since the first oxide conductive layer having a high adhesion to the base layer includes the protrusion part that is extended farther than the metal conductive layer and the second oxide conductive layer, the pixel electrodes can be hardly peeled off.

A manufacturing method of a display device includes steps of: forming a plurality of pixel electrodes; laminating a light emitting element layer on the plurality of the pixel electrodes; and laminating a common electrode on the light emitting element layer, wherein the step of forming the plurality of pixel electrodes includes steps of: forming a pattern of a first oxide conductive layer to be in a shape corresponding to the plurality of pixel electrodes so that parts corresponding to neighboring ones of the plurality of pixel electrodes are separated from one another by an inorganic insulating layer; forming a metal conductive layer having an adhesion to the inorganic insulating layer that is lower than that of the first oxide conductive layer so that the metal conductive layer is in direct contact with the inorganic insulating layer and the pattern of the first oxide conductive layer; forming a second oxide conductive layer on the metal conductive layer; and patterning the metal conductive layer and the second oxide conductive layer by wet etching so as to leave parts put on inside the pattern of the first oxide conductive layer. According to the present invention, the metal conductive layer has a low adhesion to the inorganic insulating layer, and if an etching remainder or a residue is generated on the inorganic insulating layer, they can be easily peeled off. Therefore, short-circuiting of the pattern of the first oxide conductive layer can be prevented, and the pixel electrodes can be formed with a high precision.

A display device includes: a base layer; a plurality of pixel electrodes laminated on the base layer; a light emitting element layer laminated on the plurality of the pixel electrodes; and a common electrode laminated on the light emitting element layer, wherein each of the plurality of pixel electrodes includes a first oxide conductive layer that is in direct contact with the base layer, a metal conductive layer that is in direct contact with the first oxide conductive layer, and a second oxide conductive layer that is in direct contact with the metal conductive layer, wherein the base layer is a silicon nitride film or silicon oxide film, wherein the metal conductive layer includes a material selected from a group composed of gold, aluminum, and silver, and wherein the first oxide conductive layer includes a protrusion part that is extended farther than the metal conductive layer and the second oxide conductive layer in a direction, adjacent two of the pixel electrodes facing each other in the direction.

DETAILED DESCRIPTION OF THE INVENTION

Figure 1:
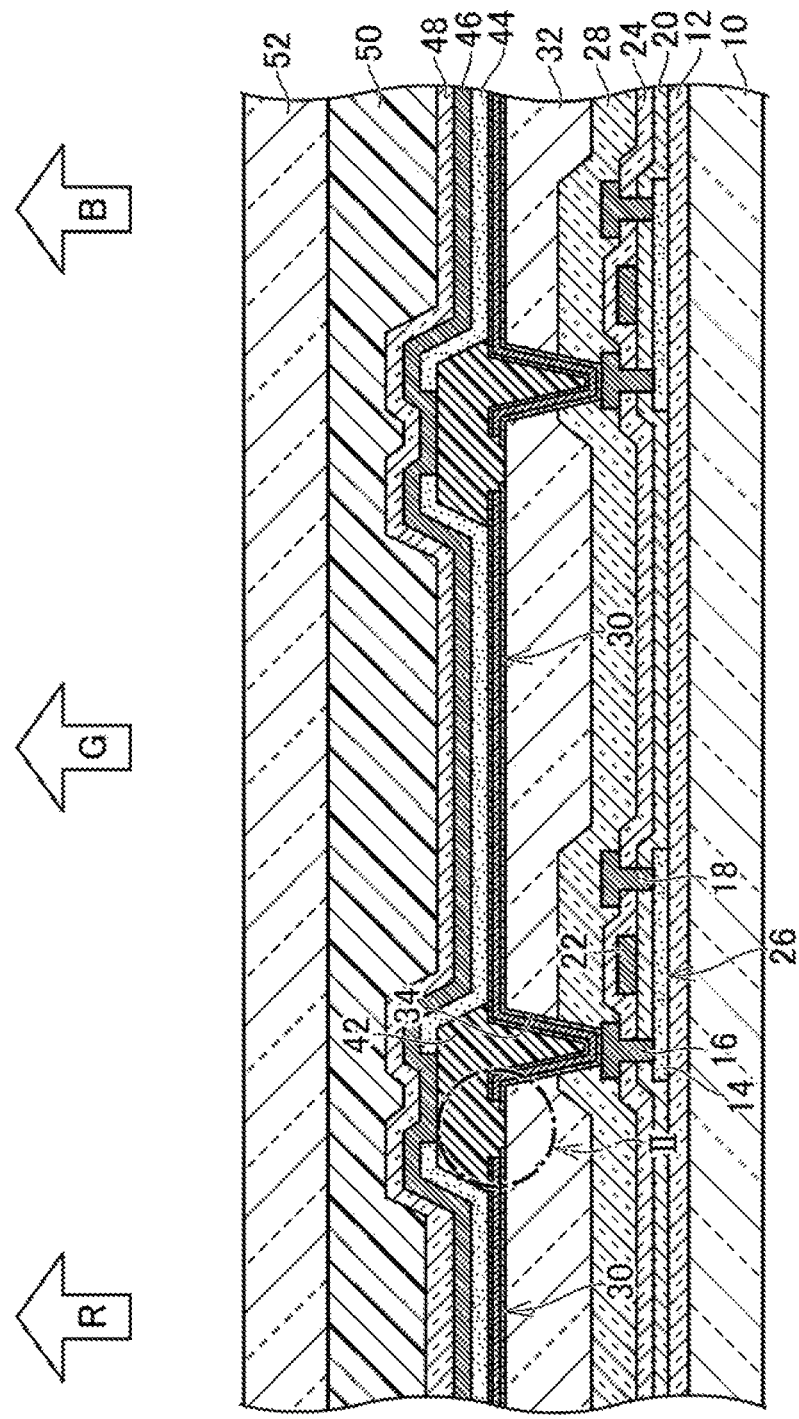
FIG. 1 is a cross sectional view illustrating a display device according to a first embodiment of the present invention.

Below, embodiments of the present invention are illustrated with reference to the accompanying drawings. The present invention can be used in various modes without departing from the spirit thereof, and the interpretation should not be limited to the description of the exemplary embodiments illustrated below.

While the width, thickness, shape, and the like of each component in the drawings may be illustrated schematically as compared with the actual embodiments in order to clarify the explanation, these are merely examples and the interpretation of the present invention should not be limited thereto. Furthermore, in the specification or respective drawings, the same reference symbols may be applied to elements that have functions similar to those that have already been illustrated in another drawing and a redundant explanation of such elements may be omitted.

Further, in the detailed explanation of the invention, when a positional relationship between one component and another component is defined, unless specified otherwise, the words "on" and "under" are not applied only to a case where the other component is directly on or directly under the one component, but may also be applied to a case where still another component is interposed between the one component and the other component.

First Embodiment

FIG. 1 is a cross sectional view of a display device according to a first embodiment of the present invention. As a display device, an organic electroluminescence display device is mentioned as an example. The display device is configured to combine unit pixels of a plurality of colors composed of, for example, red (R), green (G) and blue (B) (subpixels) to form a pixel of full color (a pixel) and display an image of full color.

The display device includes a first substrate 10 made of glass or resin. On the first substrate 10, an undercoat 12 that becomes a barrier to prevent impurities that are contained in the first substrate 10 itself from spreading toward upper layers is formed, and a semiconductor layer 14 is formed thereon. A source electrode 16 and a drain electrode 18 are provided on the semiconductor layer 14, and a gate insulating film 20 is formed covering the semiconductor layer 14. On the gate insulating film 20, a gate electrode 22 is formed, and an interlayer insulating film 24 is formed covering the gate electrode 22. The source electrode 16 and the drain electrode 18 penetrate the gate insulating film 20 and the interlayer insulating film 24. A thin film transistor 26 is constituted by the semiconductor layer 14, the source electrode 16, the drain electrode 18 and the gate electrode 22. A passivation film 28 is provided so as to cover the thin film transistor 26.

The thin film transistor 26 is electrically connected to a pixel electrode 30 (e.g., an anode). Since the passivation film 28 has ridges on its surface, a base layer 32 of the pixel electrode 30 is provided so as to form a flat surface. The base layer 32 is an inorganic insulating layer made of Silicon Nitride, Silicon Dioxide, or the like. While the base layer 32 (the inorganic insulating layer) has a low adhesion to metal, it has a high adhesion to an oxide. The base layer 32 may be constituted by two layers, namely, an organic insulating film having a high planarizing capability and the inorganic insulating film arranged thereon.

The pixel electrode 30 is laminated on the base layer 32. Specifically, a plurality of pixel electrodes 30 are provided on the base layer 32 so as to correspond to each of the plurality of pixel electrodes. The pixel electrode 30 is electrically connected to one of the source electrode 16 and the drain electrode 18 on the semiconductor layer 14 via a contact hole 34 that penetrates the base layer 32 and the passivation film 28. The pixel electrode 30 includes a part whose upper surface is planarized and a part whose upper surface gets into the contact hole 34 and is depressed.

Figure 2:
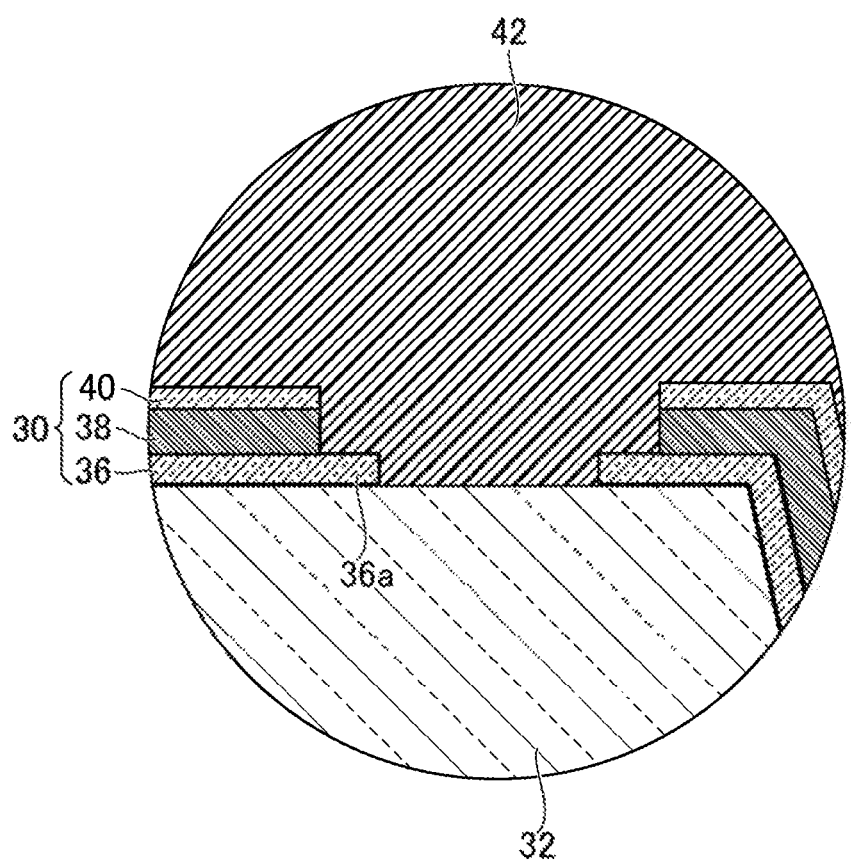
FIG. 2 is a magnified view of part II encircled by a chain line in FIG. 1.

FIG. 2 is a magnified view of part II encircled by the chain line of FIG. 1. The pixel electrode 30 includes a first oxide conductive layer 36 that is in direct contact with the base layer 32. The first oxide conductive layer 36 is formed with indium tin oxide (ITO) or indium zinc oxide (IZO). An outer periphery of the first oxide conductive layer 36 forms an outer shape of the pixel electrode 30.

The pixel electrode 30 includes a metal conductive layer 38 that is in direct contact with the first oxide conductive layer 36. The metal conductive layer 38 is formed with gold, aluminum, silver, or an alloy including at least one of those. The base layer 32 has an adhesion to the first oxide conductive layer 36 higher than that of the metal conductive layer 38. The metal conductive layer 38 is in a shape that is not extended farther than an upper surface of the first oxide conductive layer 36, so as not to touch the base layer 32.

The pixel electrode 30 includes a second oxide conductive layer 40 that is in direct contact with the metal conductive layer 38. The second oxide conductive layer 40 is formed with indium tin oxide (ITO) or indium zinc oxide (IZO). It is favorable that the second oxide conductive layer 40 is not extended farther than an upper surface of the metal conductive layer 38. The second conductive layer 40 is not in contact with either of the first oxide conductive layer 36 or the base layer 32.

The first oxide conductive layer 36 has a protrusion part 36a that is extended farther than the metal conductive layer 38 and the second oxide conductive layer 40 in a direction toward the neighboring pixel electrode 30. The first conductive oxide layer 36 has the protrusion part 36a all around the periphery of the pixel electrode 30. According to the present embodiment, since the first oxide conductive layer 36 having a high adhesion to the base layer 32 has the protrusion part 36a that is extended farther than the metal conductive layer 38 and the second oxide conductive layer 40, both of the metal conductive layer 38 and the second oxide conductive layer 40 do not contact the base layer 32, and thus the pixel electrode 30 can be hardly peeled off.

As illustrated in FIG. 1, on the base layer 32 and the pixel electrode 30, an insulating layer 42 made of an organic material such as resin is formed. The insulating layer 42 is put on a peripheral part of the pixel electrode 30, and is formed so as to form an opening at a part (e.g., a central part) of the pixel electrode 30. The opening under the insulating layer 42 becomes a light emitting region. By the insulating layer 42, a bank that surrounds the part of the pixel electrode 30 is formed.

A light emitting element layer 44 is laminated on the pixel electrode 30. The light emitting element layer 44 is put also on the insulating layer 42. The light emitting element layer 44 at least includes a light emitting layer, and may further include at least one of an electron transport layer, a hole transport layer, an electron injection layer and a hole injection layer. It is configured that at least the light emitting layer included in the light emitting element layer 44 is put on each pixel electrode 30 separately. Due to this configuration, the light emitting layer of each light emitting element layer 44 emits light of one of the plurality of colors, and a full color image display becomes possible. Note that it is possible to make an arrangement for emitting lights of the plurality of colors even if a layer other than the light emitting layer is provided on the plurality of pixel electrodes 30 continuously. As a variation, the whole of the light emitting element layer 44 including the light emitting layer may be formed so as to be put on the plurality of pixel electrodes 30 continuously. In such a case, the emitted light is monochromatic, and the full color image display becomes possible by passing the light through a color filter.

On the light emitting element layer 44, a common electrode 46 (e.g., an anode) is provided so as to contact the light emitting element layer 44 over the plurality of pixel electrodes 30. The common electrode 46 is formed so as to be put on the insulating layer 42 that becomes the bank. The common electrode 46 contacts the insulating layer 42 at a region between neighboring light emitting layers 44. The light emitting layer 44 is held between the pixel electrode 30 and the common electrode 46, and emits light with its luminance controlled by a current that runs therebetween.

The light emitting element layer 44 is sealed by being covered by a sealing layer 48 that is laminated on the common electrode 46 and is shut off from moisture. Above the sealing layer 48, a second substrate 52 is provided with an interposition of a filling layer 50. In this embodiment, the color filter is unnecessary because the light emitting element layer 44 is provided so as to emit lights in the plurality of colors, but in the case where the light emitting element layer 44 is provided so as to emit only monochromatic light, the color filter is laminated on the second substrate 52. Further, if necessary, a black matrix (not shown) may be provided. The second substrate 52 may be a touch panel, and may be provided with a polarizing plate a retardation plate.

Note that the display device is not limited to the organic electroluminescence display device. It may be a display device that is provide with a light emitting element such as a quantum-dot light emitting diode (QLED) on each pixel and may be a liquid crystal display device.

FIGS. 3A to 4C are views illustrating a manufacturing method of the display device according to the first embodiment of the present invention. The manufacturing method of the display device includes a process to form the plurality of pixel electrodes 30 (see FIG. 1). The process that is performed until the base layer 32 is formed is obvious due to the above description with reference to FIG. 1, and thus the explanation thereof is omitted.

Figure 3A:
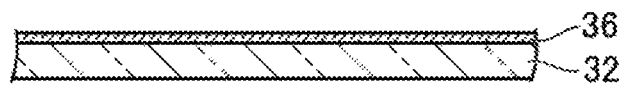
FIG. 3A is a view illustrating a manufacturing method of the display device according to the first embodiment of the present invention.

As illustrated in FIG. 3A, the first oxide conductive layer 36 is formed on the entire surface of the base layer 32. The base layer 32 is an inorganic insulating layer made of silicon nitride, silicon dioxide, or the like. The first oxide conductive layer 36 is formed with indium tin oxide (ITO) or indium zinc oxide (IZO) by, for example, a vapor deposition.

Figure 3B:
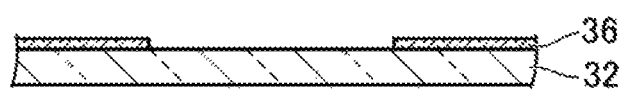
FIG. 3B is a view illustrating the manufacturing method of the display device according to the first embodiment of the present invention.

As illustrated in FIG. 3B, the first oxide conductive layer 36 is patterned. Specifically, the pattern of the first oxide conductive layer 36 is formed in a shape that corresponds to the plurality of pixel electrodes 30 illustrated in FIG. 1, so that parts corresponding to neighboring pixel electrodes 30 are isolated from one another on the base layer 32 (the inorganic insulating layer). In other words, the first oxide conductive layer 36 is patterned so that the parts corresponding to the neighboring pixel electrodes 30 are surrounded by an exposed surface of the base layer 32 (the inorganic insulating layer). For the patterning, a known method can be adopted.

Figure 3C:
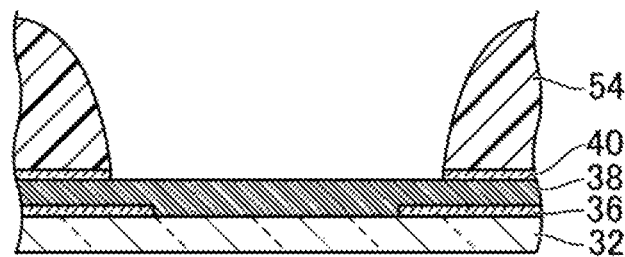
FIG. 3C is a view illustrating the manufacturing method of the display device according to the first embodiment of the present invention.

As illustrated in FIG. 3C, the metal conductive layer 38 and the second oxide conductive layer 40 are laminated on the pattern of the first oxide conductive layer 36. Specifically, the metal conductive layer 38 having the adhesion to the inorganic insulating layer lower than that of the first oxide conductive layer 36 is formed so as to be in direct contact with the base layer 32 and the pattern of the first oxide conductive layer 36. The metal conductive layer 38 is formed with gold, aluminum, silver, or an alloy including at least one of those. Then, the second oxide conductive layer 40 is formed on the metal conductive layer 38. The second oxide conductive layer 40 is formed with indium tin oxide, or indium zinc oxide. the metal conductive layer 38 and the second oxide conductive layer 40 are formed by, for example, a sputtering method or the like.

Further, an etching mask 54 is formed on the second oxide conductive layer 40. The etching mask 54 is formed by applying a photolithography with a photoresist so that it is a little smaller than the outer shape of the plurality of pixel electrodes 30 illustrated in FIG. 1 (the pattern of the first oxide conductive layer 36). The etching mask 54 is in a shape to avoid an overlap with the peripheral part (the protrusion part 36a) of the pattern of the first oxide conductive layer 36.

Figure 4A:
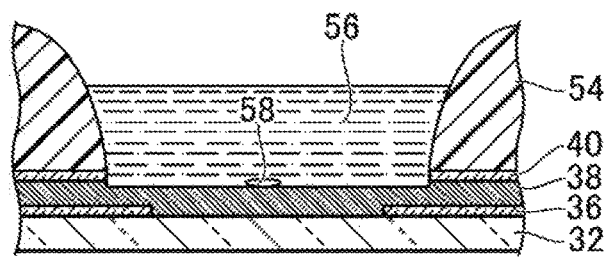
FIG. 4A is a view illustrating the manufacturing method of the display device according to the first embodiment of the present invention.

As illustrated in FIG. 4A, the second oxide conductive layer 40 and the metal conductive layer 38 are patterned by wet etching so that parts on which the etching mask 54 is put are left. The parts on which the etching mask 54 is put are parts that overlap the pattern of the first oxide conductive layer 36 (a region that does not include the peripheral part). Etching liquid 56 is at least one of the mixed acid and oxalic acid. For example, the second oxide conductive layer 40 and the metal conductive layer 38 may be etched all together with the mixed acid, and it may be configured that the second oxide conductive layer 40 is etched first with the oxalic acid and then subsequently the metal conductive layer 38 is etched with the mixed acid.

A part of the second oxide conductive layer 40 is removed by the etching and then the metal conductive layer 38 is not covered. Further, in the etching of the metal conductive layer 38 with the mixed acid nitrogen monoxide (NO) gas 58 is generated by a chemical reaction between them. There is a case where the nitrogen monoxide gas 58 is attached to the surface of the metal conductive layer 38, and a part of the surface of the metal conductive layer 38 is passivated.

Figure 4B:
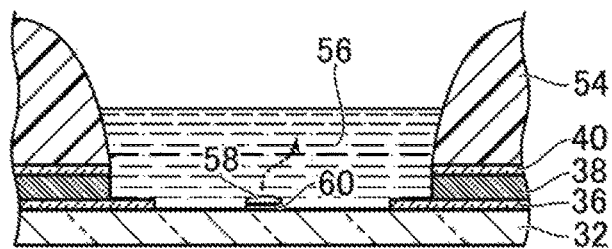
FIG. 4B is a view illustrating the manufacturing method of the display device according to the first embodiment of the present invention.

As illustrated in FIG. 4B, as to the metal conductive layer 38, the part of the metal conductive layer 38 passivated by the nitrogen monoxide 58 remains even when the etching proceeds. For example, between the neighboring pixel electrodes 30, a residue 60 (a film remainder) of the metal conductive layer 38 is generated. The residue 60 of the metal conductive layer 38 is lifted-off from the base layer 32 (the inorganic insulating layer). This is caused by an infiltration of the etching liquid 56 (the mixed acid) into an interface between the metal conductive layer 38 and the inorganic insulating layer, due to the low adhesion of the metal conductive layer 38 to the inorganic insulating layer. The residue 60 of the metal conductive layer 38 is removed from the surface of the inorganic insulating layer that is not covered by the first oxide conductive layer 36, and as a result thereof short-circuiting of the pattern of the first oxide conductive layer 36 can be prevented.

Figure 4C:
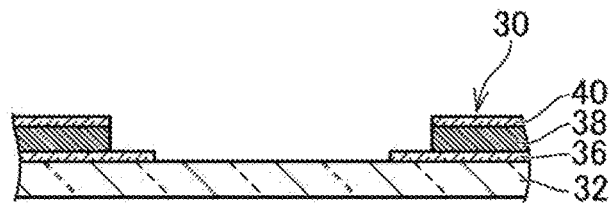
FIG. 4C is a view illustrating the manufacturing method of the display device according to the first embodiment of the present invention.

As illustrated in FIG. 4C, the pixel electrode 30 can be formed with a high precision. Subsequently, after the insulating layer 42 is formed, the light emitting element layer 44 is laminated on the plurality of pixel electrodes 30, and the common electrode 46 is laminated on the light emitting element layer 44. Those processes are obvious due to the above description with reference to FIG. 1, and thus the explanation thereof is omitted.

Second Embodiment

Figure 5:
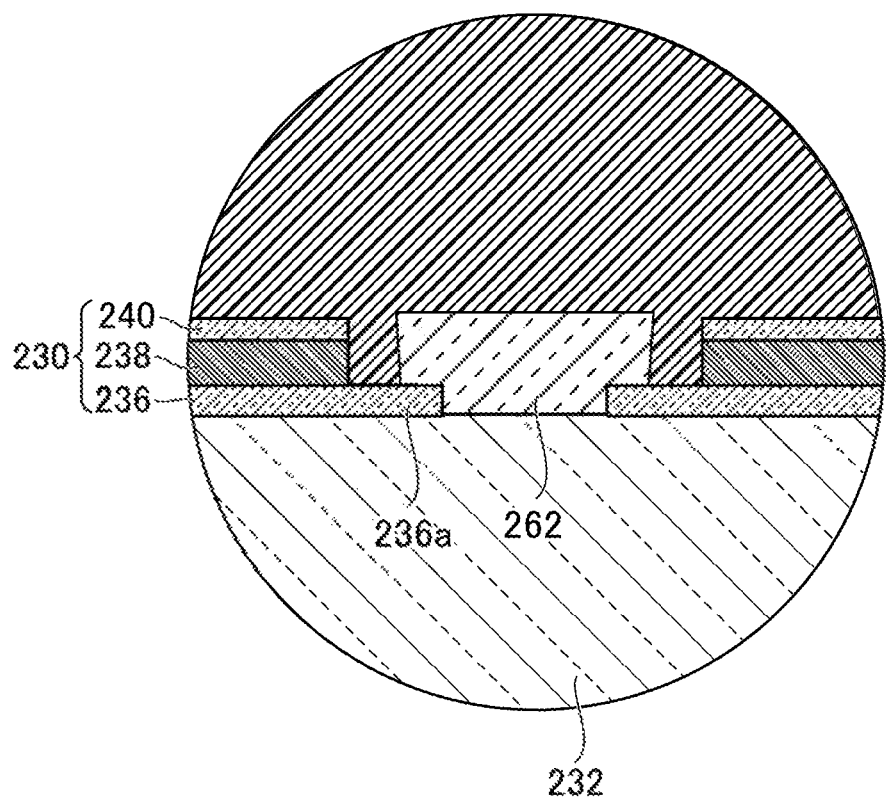
FIG. 5 is a magnified cross sectional view illustrating a part of a display device according to a second embodiment of the present invention.

FIG. 5 is a magnified cross sectional view illustrating a part of a display device according to a second embodiment of the present invention. In this embodiment, a pixel electrode 230 is formed on a base layer 232, and an inorganic insulating layer 262 is put on at least a tip of a protrusion part 236a of the first oxide conductive layer 236 and on the base layer 232. The inorganic insulating layer 262 is formed with a space from a tip of a metal conductive layer 238 and a tip of a second oxide conductive layer 240. That is, the inorganic insulating layer 262 is provided separately from the base layer 232.

FIGS. 6A to 7B are views illustrating a manufacturing method of the display device according to the second embodiment of the present invention.

Figure 6A:
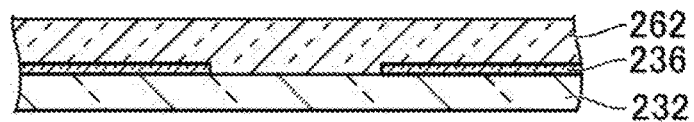
FIG. 6A is a view illustrating a manufacturing method of the display device according to the second embodiment of the present invention.

As illustrated in FIG. 6A, a pattern of the first oxide conductive layer 236 is formed on the base layer 232, and further the inorganic insulating layer 262 made of silicon nitride, silicon dioxide, or the like is formed. A formation method of the pattern of the first oxide conductive layer 236 is similar to the one explained regarding the first embodiment. The inorganic insulating layer 262 is formed on the base layer 232, for example, over the entire surface, including a region where the base layer 232 is not covered by the pattern of the first oxide conductive layer 236.

Figure 6B:
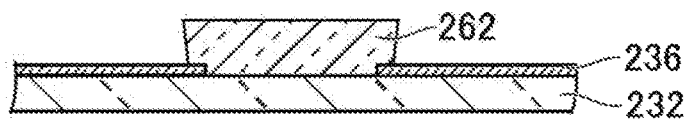
FIG. 6B is a view illustrating the manufacturing method of the display device according to the second embodiment of the present invention.

As illustrated in FIG. 6B, the inorganic insulating layer 262 is patterned. Specifically, the inorganic insulating layer 262 is patterned so that it is put on a tip of the pattern of the first oxide conductive layer 236, but is not put on the whole surface of the protrusion part 236a of the pixel electrode 230 illustrated in FIG. 5. The inorganic insulating layer 262 is left on the base layer 232 that is not covered by the pattern of the first oxide conductive layer 236. With this configuration, the patterns of the neighboring first oxide conductive layers 236 are electrically insulated from one another by the inorganic insulating layer 262.

Figure 6C:
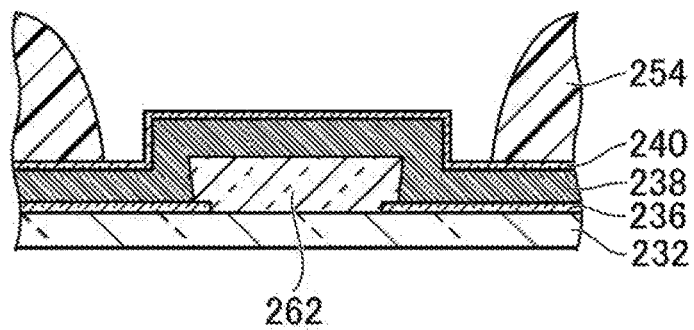
FIG. 6C is a view illustrating the manufacturing method of the display device according to the second embodiment of the present invention.

As illustrated in FIG. 6C, on the patterned inorganic insulating layer 262, the pattern of the first oxide conductive layer 236 and the base layer 232, the metal conductive layer 238 and the second oxide conductive layer 240 are laminated. Further, on the second oxide conductive layer 240 an etching mask 254 is formed. The process illustrated in FIG. 6C is the same with the contents that have been explained with reference to FIG. 3C, except for a point that the inorganic insulating layer 262 is provided in addition to the base layer 232.

Figure 7A:
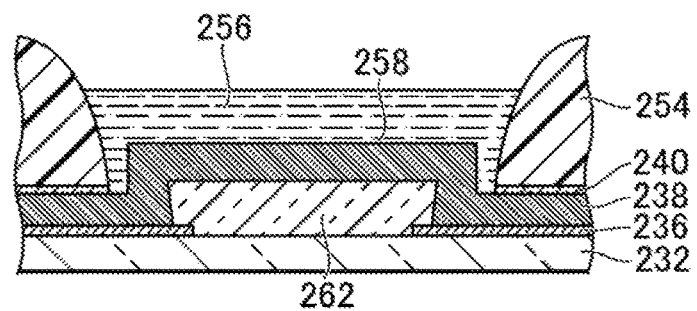
FIG. 7A is a view illustrating the manufacturing method of the display device according to the second embodiment of the present invention.

As illustrated in FIG. 7A, the second oxide conductive layer 240 and the metal conductive layer 238 are patterned by wet etching. In a region where the second oxide conductive layer 240 is removed by the etching, the metal layer 238 is not covered. Further, in the etching of the metal layer 238 where mixed acid is used as etching liquid 256, nitrogen monoxide (NO) gas 258 is generated by a chemical reaction between them. The nitrogen monoxide gas 258 is attached to the surface of the metal conductive layer 238, and a part of the surface of the metal conductive layer 238 is passivated.

Figure 7B:
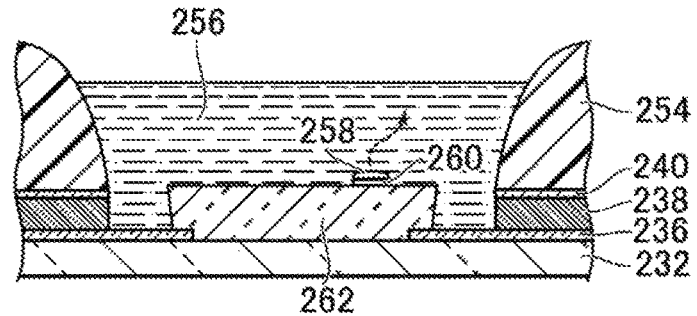
FIG. 7B is a view illustrating the manufacturing method of the display device according to the second embodiment of the present invention.

As illustrated in FIG. 7B, as to the metal conductive layer 238, the part of the metal conductive layer 238 passivated by the nitrogen monoxide gas 258 remains even when the etching proceeds, and on the inorganic insulating layer 262 a residue 260 (a film remainder) of the metal conductive layer 238 is generated. However, the residue 260 of the metal conductive layer 238 is lifted-off from the inorganic insulating layer 262. This is caused by an infiltration of the etching liquid 256 (the mixed acid) into an interface between the metal conductive layer 238 and the inorganic insulating layer 262, due to the low adhesion of the metal conductive layer 238 to the inorganic insulating layer 262. The residue 260 of the metal conductive layer 238 is removed from the surface of the inorganic insulating layer 262, and as a result thereof short-circuiting of the pattern of the first oxide conductive layer 236 can be prevented.

The residue 260 of the metal conductive layer 238 that is attached to the lateral surface is easily peeled off since it is originally thin. If the lateral side of the inorganic insulating layer 262 is in a shape that steeply rises (e.g., an inversed tapered shape), it is still more easily peeled off. It is favorable that a corner part constituted by an upper surface and the lateral surface of the inorganic insulating layer 262 is a right angle or an acute angle at its cross section orthogonal to the upper surface. With this configuration where the neighboring pixel electrodes are certainly separated from each other, it becomes possible to form the pixel electrode 230 with a high precision. After that, on the pixel electrode 230 illustrated in FIG. 5, the light emitting element layer 44 is laminated as illustrated in FIG. 1, and the common electrode 46 is laminated on the light emitting element layer 44. Those processes are obvious due to the above description with reference to FIG. 1, and thus the explanation thereof is omitted.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a base layer;
   a plurality of pixel electrodes laminated on the base layer;
   a light emitting element layer laminated on the plurality of the pixel electrodes;
   an insulation layer arranged between a peripheral region of each of the pixel electrodes and the light emitting element layer, the insulation layer including an inorganic insulation layer and an organic insulation layer on the inorganic insulation layer, and
   a common electrode laminated on the light emitting element layer,
   wherein each of the plurality of pixel electrodes comprises a first oxide conductive layer that is in direct contact with the base layer, a metal conductive layer that is in direct contact with the first oxide conductive layer, and a second oxide conductive layer that is in direct contact with the metal conductive layer,
   the first oxide conductive layer has a first portion, a second portion, and a third portion,
   the first portion has a first upper surface in contact with the metal conductive layer, and
   the second portion has a second upper surface in contact with the organic insulation layer, the second portion surrounding the first portion,
   the third portion has a third upper surface in contact with the inorganic insulation layer, the third portion surrounding the second portion.

2. The display device according to claim 1, wherein the first oxide conductive layer has the third portion at an edge of each of the pixel electrodes.

3. The display device according to claim 1, wherein the first oxide conductive layer and the second oxide conductive layer respectively include a material selected from a group composed of indium tin oxide and indium zinc oxide, and
   wherein the metal conductive layer includes a material selected from a group composed of gold, aluminum, and silver.

4. The display device according to claim 1, wherein the base layer is a silicon nitride film or silicon oxide film,
   wherein the first oxide conductive layer includes a protrusion part that is extended farther than the metal conductive layer and the second oxide conductive layer in a direction, adjacent two of the pixel electrodes facing each other in the direction.

5. The display device according to claim 4, wherein the first oxide conductive layer has the third portion at an edge of each of the pixel electrodes.

6. The display device according to claim 1, wherein the organic insulation layer has a portion in contact with the second upper surface,
   the portion of the organic insulation layer is arranged between a side surface of the metal conductive layer and the inorganic insulation layer.

* * * * *